United States Patent [19]

Honda

[11] Patent Number: 4,631,473
[45] Date of Patent: Dec. 23, 1986

[54] TRANSIENT ELECTROMAGNETIC FIELD DETECTOR

[75] Inventor: Masamitsu Honda, Tokyo, Japan

[73] Assignee: Nippon Univac Kaisha, Ltd., Tokyo, Japan

[21] Appl. No.: 675,252

[22] Filed: Nov. 27, 1984

Related U.S. Application Data

[63] Continuation of Ser. No. 413,717, Sep. 1, 1982, abandoned.

[30] Foreign Application Priority Data

Sep. 7, 1981 [JP] Japan .................. 56-140784

[51] Int. Cl.$^4$ .......................................... G01R 31/02
[52] U.S. Cl. ................... 324/72.5; 324/95; 324/102
[58] Field of Search .............. 343/703; 324/72, 72.5, 324/95, 102, 106, 457, 458; 340/600; 455/67

[56] References Cited

U.S. PATENT DOCUMENTS

| | | | |
|---|---|---|---|
| 3,020,402 | 2/1962 | Brodsky et al. | 340/600 |
| 3,109,988 | 11/1963 | Hoover | 343/703 |
| 3,130,368 | 4/1964 | Hoover | 343/703 |
| 3,147,439 | 9/1964 | Eakin | 343/703 |
| 3,586,973 | 6/1971 | Lawton et al. | 343/703 |
| 3,636,641 | 1/1972 | Daskam | 455/67 |
| 3,641,439 | 2/1972 | Aslan | 324/106 |
| 3,753,116 | 8/1973 | Kolbly | 343/703 |
| 3,891,919 | 6/1975 | Penninger | 340/600 |
| 3,931,573 | 1/1976 | Hopfer | 324/106 |
| 3,940,700 | 2/1976 | Fischer | 340/600 |
| 4,072,899 | 2/1978 | Shimp | 324/95 |
| 4,127,817 | 11/1978 | Bell, Jr. | 455/67 |
| 4,214,210 | 7/1980 | O'Shea | 324/72 |
| 4,392,106 | 7/1983 | Yakouleu et al. | 324/72.5 |
| 4,423,372 | 12/1983 | Bini et al. | 324/72 |

FOREIGN PATENT DOCUMENTS

| | | |
|---|---|---|
| 110379 | 1/1976 | Japan . |
| 82489 | 9/1978 | Japan . |
| 562483 | 5/1975 | Switzerland ............ 340/600 |

OTHER PUBLICATIONS

Muhr, M., UFO Detector, Elektor, (Jul./Aug. 1979), vol. 51/52, No. 7–8.

Primary Examiner—Stewart J. Levy
Assistant Examiner—Kevin D. O'Shea
Attorney, Agent, or Firm—Brumbaugh, Graves, Donohue & Raymond

[57] ABSTRACT

A high frequency electromagnetic field detector for detecting high frequency electromagnetic fields comprises a micro antenna for mainly receiving the induction term of the electromagnetic field, an amplifier for amplifying a voltage induced on the antenna, a comparator circuit for comparing the output of the amplifier with a predetermined reference level to output a signal indicating that the output exceeds the reference level, and an indicator in response to the signal from the comparator circuit for indicating it.

7 Claims, 4 Drawing Figures

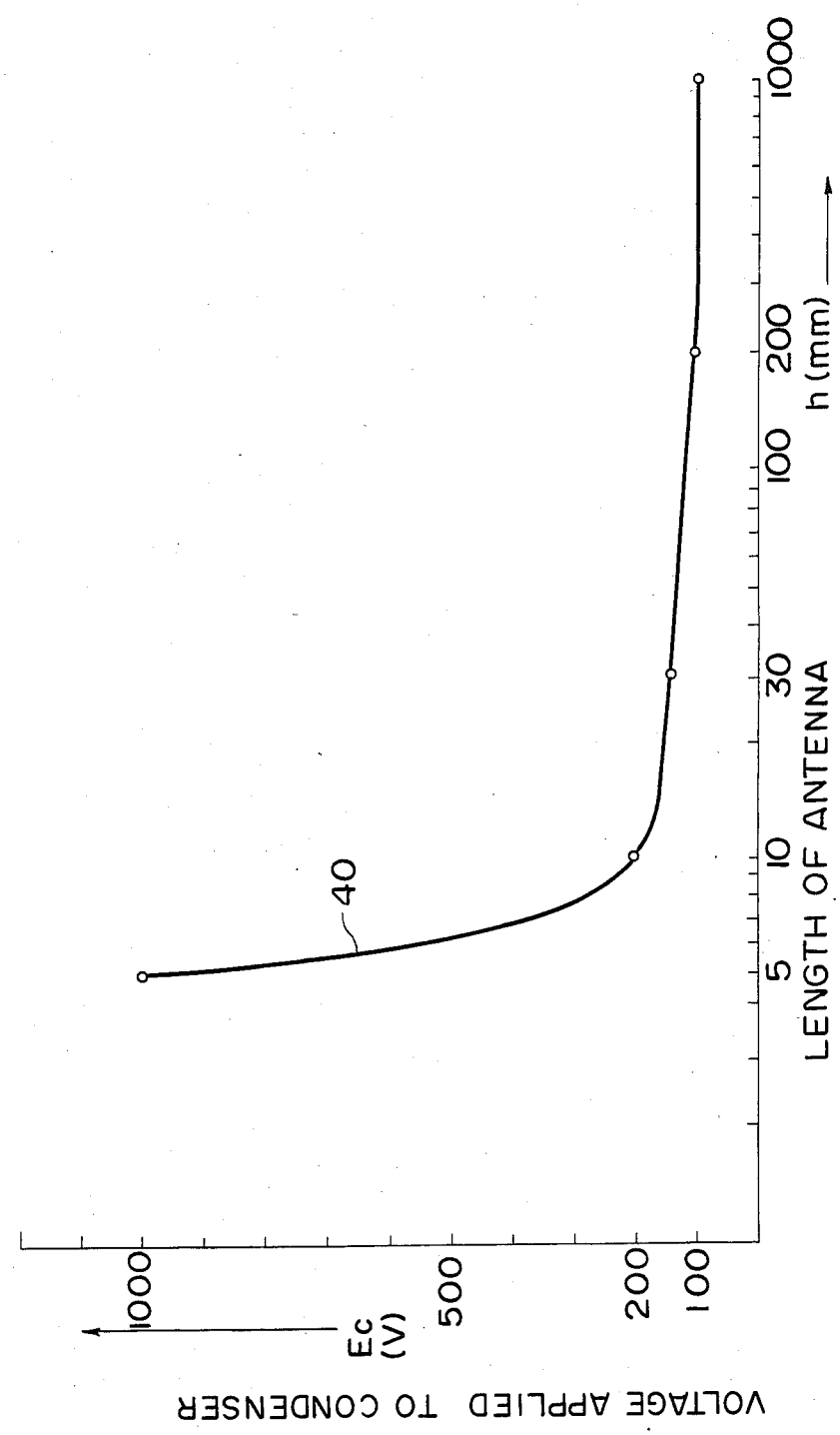

TRANSIENT ELECTROMAGNETIC FIELD DETECTOR

This application is a continuation of application Ser. No. 413,717, filed on Sept. 1, 1982, now abandoned.

BACKGROUND OF THE INVENTION

1. Field of the Invention

The present invention relates to a transient electromagnetic field detector.

2. Description of the Prior Art

Electronic equipments are generally susceptible to even weak disturbing energy. Particularly, digital equipments such as a computer performing a high speed data processing are susceptible to such disturbing energy, whereby they are liable to malfunction. For example, logic elements commonly used in these digital equipments may cause logical inversion in response to a disturbing pulse of several nanoseconds, and these digital equipments are also sensible to the high frequency disturbing energy of 50 MHz–200 MHz. As sources of such transient disturbing energy, listed are noise caused by electrostatic discharge, noise at switching a power supply, and noise from a car engine which are so-called electromagnetic interference (EMI) sources, and particularly, noise components propagated by induction and radiation are regarded as important. For example, the instant a charged human body or utensil touches an equipment in operation, circuits may take such a logical state that cannot be expected to occur from the standpoint of design, thereby malfunctioning or stopping operation. Accordingly, it is necessary to work out an adequate countermeasure against such electromagnetic interference with its occurrence being presupposed in advance. At present, as an equipment for sensing and analyzing the presence of such EMI, a transient digitizer is known, but it is very expensive. An electric field strength meter, a power flux density meter, an EMI meter, and a spectrum analyzer are also known, but these instruments can merely measure continuous waves. Furthermore, a storage oscilloscope, a waveform memory, a memory voltmeter (or quasi-peak voltmeter), and a logic analyzer are also known, but these have had limitations in their measurable frequencies. Additionally, since, in these instruments, the conductive component of the disturbing energy was inevitably carried by signal cables and power cables connected to and from a measuring system, it was very difficult to measure the true radiation component separately. A high frequency electromagnetic field sensor for detecting transient electromagnetic fields causing such EMI has also been proposed, but this high frequency electromagnetic field sensor employs a dipole antenna having a length tuned to the frequency of an electromagnetic field to be detected, in accordance with the concept of a usual tuned antenna. Therefore, in order to detect the EMI of 50 MHz–200 MHz which is regarded as particularly important for digital equipments, the length of the antenna inevitably became several tens centimeters to one meter, and hence the whole sensor became large; further, also its measuring sensitivity varies in dependence on its tuned frequency and directivity; and therefore the sensor has not had a wide range of application.

In view of the above described prior art, it is an object of the present invention to provide a transient electromagnetic field detector which is inexpensive and of small size, whose sensitivity does not depend on the frequency, and which is broadly usable to detection and analysis of the electromagnetic interference.

SUMMARY OF THE INVENTION

In accordance with the present invention, there is provided a high frequency electromagnetic field detector for detecting high frequency electromagnetic fields, comprising a micro-antenna for mainly receiving the induction term of the electromagnetic fields, an amplifier for directly receiving and amplifying a voltage induced on the antenna, a comparator circuit for comparing the output of the amplifier with a predetermined reference level to output a signal indicating that the output exceeds the reference level, and an indicator in response to the signal from the comparator circuit for indicating it.

BRIEF DESCRIPTION OF THE DRAWINGS

Now, the present invention will be described in more detail with respect to the fundamental principle and a preferred embodiment of the invention with reference to the accompanying drawings, in which:

FIG. 4 is a view showing the relation between the voltage applied across a capacitor and the length of an antenna in accordance with the results of the experiment done by the experiment set of FIG. 3.

DESCRIPTION OF THE PREFERRED EMBODIMENTS

The inventor of this application has found from the result of various experiments that, in order to detect the EMI as described above, the reception of high frequency electromagnetic fields is more effectively achieved by the way for mainly capturing the induction magnetic field rather than by the way generally used in the prior art using a tuned antenna which mainly captures the radiation magnetic field.

Figure 1:
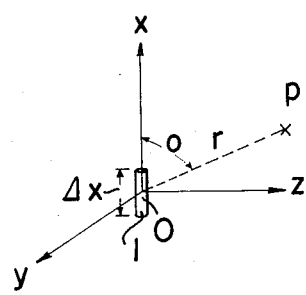
FIG. 1 is a view for explaining the fundamental principle of the invention.

This will be theoretically explained below. When a high frequency current I(A) is flowing in a Hertz doublet 1 having a length of $\Delta x$ (m) as shown in FIG. 1 of accompanying drawings, a magnetic field at a point P having a distance of r(m) and an angular direction of $\theta$(rad) from the doublet 1 can be defined by the following equation, $$H = \frac{I\Delta x}{4\pi r^2} \sin\theta \cdot \epsilon^{-j\beta r} + j\frac{I\Delta x}{2r\lambda} \sin\theta \cdot \epsilon^{-j\beta r} (AT/m)$$

where $\lambda$ = electromagnetic field's wavelength (m)

$j\beta = j2\pi/\lambda$

As can be known from the above equation, the magnetic field comprises a first term Hi proportional to $1/r^2$ and a second term Hr proportional to $1/r\lambda$. Near the Hertz doublet, the magnetic field may be considered to consist of only the first term because $1/r^2 >> 1/r$, and thus the first term is referred to an induction field. As compared with this, at a great distance the magnetic field consists of only the second term because $1/r^2 \approx 0$. The second term is proportional to the frequency of a current flowing in the doublet (i.e. inversely proportional to wavelength λ), so that it is considered that the radiation of energy as electromagnetic waves is defined by the second term, and thus the second term is referred to a radiation magnetic field. Therefore, in the prior art, with respect to capturing the electromagnetic field, it has been attempted to capture the radiation magnetic field, and therefore, tuned (or matched) antennas have been generally used. For the tuned antenna, an antenna's effective length, gain, etc. are all determined in dependence on the frequency (or wavelength λ) of an electromagnetic field to be received, and therefore, it has been considered that, for some frequencies, the use of a long antenna having a length of about one meter may be inevitable.

On the other hand, the inventor of this application noticed that, as in the case of electrostatic discharge, a transient electromagnetic field is sometimes generated which includes only the so-called induction or first term without being accompanied with the radiation or second term, and furthermore found that if the capture of only the induction term is attempted, the capture is independent of the frequency of the electromagnetic field, that is, it can be achieved without applying the conventional concept in which the tuned antenna is used, and hence capturing only the voltage proportional to the induction magnetic or electric field serves for the purpose and it is more effective than the conventional concept.

The inventor of this application achieved the invention by noticing that, as described above, if it is attempted to capture the voltage proportional to the induction magnetic or electric field, as is apparent from the above equation, any short antenna may be used independently of the frequency of the electromagnetic field, and the reduction of an induced voltage due to the use of a micro-antenna can be compensated by amplifying that voltage.

Figure 2:
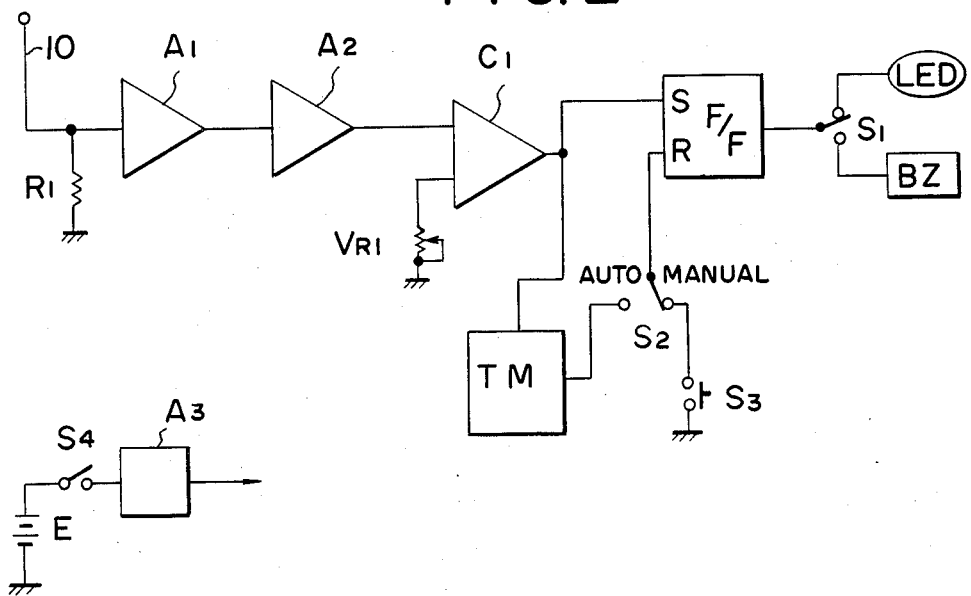
FIG. 2 is a schematic diagram showing an arrangement of a transient electromagnetic field detector as an embodiment of the invention.

Now, a transient electromagnetic field detector as an embodiment of the invention will be described in connection with FIG. 2 of the accompanying drawings.

The transient electromagnetic field detector includes a micro rod antenna 10 having a length of 10 mm for receiving transient electromagnetic fields. If a transient electromagnetic field caused by electrostatic discharge and the like is generated near the detector, then a voltage proportional to only the induction term of the electromagnetic field is induced. The induced voltage enters through an input resistor $R_1$ an preamplifier $A_1$, by which it is amplified, for example, to 30 times in voltage gain to be supplied to a buffer amplifier $A_2$ of the next stage. The voltage is further amplified at the amplifier $A_2$, for example, to 16 times to be supplied to one of the inputs of a comparator $C_1$ A reference voltage level for detecting electromagnetic fields is given to the other input of the comparator $C_1$ by a variable resistor $V_{R1}$. When the amplified voltage corresponding to the voltage induced on the antenna 10 is applied to the one input of the comparator $C_1$, it is compared with the reference voltage applied to the other input of the comparator $C_1$; when it is larger than the reference level, then the comparator $C_1$ provides an output signal which triggers a bistable multivibrator F/F (flip-flop) to change it into the SET state. At this time, if an indication changing switch $S_1$ is connected to a light emission diode indicator LED, the light emission diode indicator LED is lighted to indicate that an electromagnetic field noise exceeding a predetermined level has come in. On the other hand, the RESET input of the bistable multivibrator F/F is connected from a timer circuit TM through an auto/manual reset select switch $S_2$. If the switch $S_2$ is connected to the auto side, the timer circuit TM automatically resets the bistable multivibrator F/F, for example, after about seven seconds to prepare for reentrance of the electromagnetic field noise. If the switch $S_2$ is connected to the manual side, the state of the light emission diode indicator LED in indication is maintained until a reset switch $S_3$ is pushed down. The light emission diode indicator LED is provided to give a visual indication, while a buzzer BZ is provided to give an aural indication; these are selectively used by switching the indication changing switch $S_1$. The transient electromagnetic field detector has a power source such as a battery E built-in, by which battery E the foregoing components are appropriately energized through a power source switch $S_4$ and a voltage regulator $A_3$. In order to completely eliminate the influence of the conduction component coming via a power supply line, it is preferable to compactly put the foregoing components, including the battery E, together in one housing.

Although in this embodiment the comparator circuit $C_1$ performs the comparison with one reference level, the proper modification of this comparator enables the detection sensitivity of the electromagnetic field noise to be divided into, for example, three grades. In this case, the corresponding provision of three light emission diodes achieves the purpose, while, for the buzzer, it may be adapted to produce three different tones or to be capable of identifying the intensity of sound by encoding it in three steps.

In this embodiment, the micro rod antenna 10 of length 10 mm is used as an antenna for receiving the transient electromagnetic field, because it is attempted in accordance with the foregoing principle of the present invention to capture the induction term of the electromagnetic field rather than the radiation term thereof. If the capture of the radiation term was attempted as in the prior art, assuming the frequency of an electromagnetic field to be received, for example, as 100 MHz a tuned antenna to be used would have to be as long as 75 cm. In comparison with such a turned antenna, it can be said that the rod antenna of length 10 mm is of a micro size. Moreover, the selection of length 10 mm for the rod antenna 10 in this embodiment is based on the fact that it was ascertained by the following experiment that that length is suitable for making the antenna as small as possible and further for capturing the electromagnetic field at such a sensitivity that the gain of a rear stage amplifier need not be made excessively large.

Figure 3:
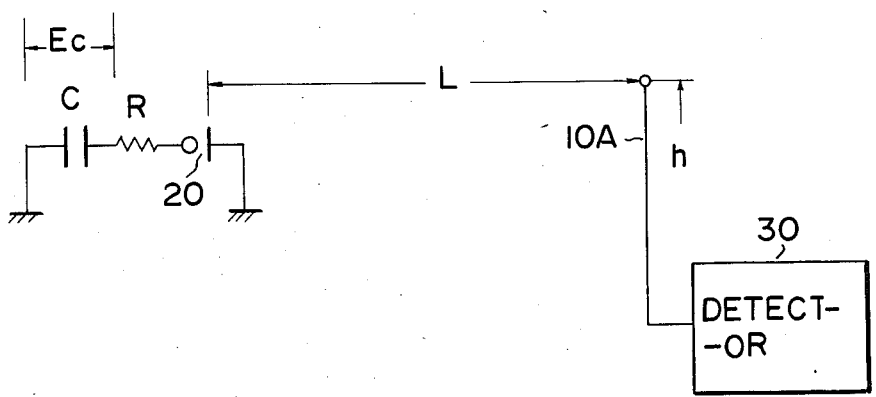
FIG. 3 is a schematic diagram of an experiment set.

Namely, this experiment was performed by an experiment set as schematically shown in FIG. 3. A series circuit of a capacitor C, a resistor R, and a discharge gap 20 was constructed to generate testing electromagnetic fields and a voltage Ec (V) applied to the capacitor C was varied to cause discharge at a discharge gap 20. A rod antenna 10A of a detector 30 having a construction as described above was arranged at a distance L=1 m from the discharge gap 20, and the length of h (mm) of the rod antenna 10A was varied. In this experiment, C=120 (PF) and R=50 (Ω) were selected, whereby discharge having a time constant τ of approximately 6 ns ($\tau = CR = 120 \times 10^{-12} \times 50 = 6 \times 10^{-9} = 6(ns)$) was generated at the discharge gap 20. Therefore, the electromagnetic field produced by the discharge may be considered to include the electromagnetic field having frequencies of the order of one hundred and several tens megahertz as a main component.

In the experiment as described above, in the case where the length of the rod antenna 10A was selected as 5 mm, a voltage Ec applied to the capacitor had to be 1000 V to detect the electromagnetic field by the detector 30. In the case where the rod antenna 10A was 10 mm long, the electromagnetic field was detected by the detector 30 when the voltage Ec applied to the capacitor C was 200 V. When the length of the rod antenna 10A was selected as 30 mm, the electromagnetic field was detected by the detector 30 when the voltage Ec was 150 V. In the case where the length of the rod antenna 10A was 200 mm, the electromagnetic field was detected by the detector 30 when the voltage Ec was 105 V. In the case where the length of the rod antenna 10A was 1000 mm, the electromagnetic field was detected by the detector 30 when the voltage Ec was 100 V. Showing these experimental results by plotting the voltage Ec applied to the capacitor C on the ordinate and the length h of the antenna on the abscissa (logarithmic scale), a curve 40 is obtained which shows the relationship between the voltage applied to the capacitor C and the length of the antenna as shown in FIG. 4. As is apparent from the curve 40, when the length of the antenna becomes shorter than 10 mm, the detection sensitivity rapidly decreases, while even if the length of the antenna is made considerably longer than 10 mm, the detection sensitivity does not change much. Accordingly, for the purpose of miniaturizing it can be said that to reduce the size of the antenna as much as possible without reducing the detection sensitivity so much, it is preferable to choose values near 10 mm as the length of the antenna. Of course, the present invention does not limit the length of the antenna to 10 mm, but any length may be allowed for the antenna if it can capture the induction term in the good sensitivity in conjunction with the strength of the electromagnetic field to be detected and the gain of the amplifier to be connected to the antenna. Furthermore, although in this embodiment the micro antenna is embodied by a rod antenna, the present invention is not limited to this, but any antenna which can capture the induction term may be available, for example, a disc-like, sphere-like, or slot-like antenna may be used.

The space and the cost occupied by the antenna and the tuning circuit in the high frequency electromagnetic sensor of this type occupy a considerably larger part of the whole space and cost in comparison with those of other circuit components. Since the transient electromagnetic field detector of the present invention has the antenna made in a micro size, it is made very small sized also with respect to the entire detector and very inexpensive in its cost. Moreover, advantageously, since the detector of the invention substantially captures only the induction term of the electromagnetic field, it is independent of the frequency of the electromagnetic field to be detected, can always detect and analyze the electromagnetic field in constant sensitivity independently of the type of electromagnetic field generating sources, and may make only an EMI generating source at no great distance as the object for detection.

As previously described, the detector of the present invention can be miniaturized throughout the whole device including the antenna, so that, advantageously, it can be easily disposed in any cabinet of digital equipments, and it can be also used to ascertain the shielding performance of the cabinet of digital equipments against external noises.

I claim:
1. A transient electromagnetic field detector for detecting a low strength transient electromagnetic field having a duration of less than a microsecond, comprising:
  a broadband rod antenna less than 30 mm long for producing a voltage due to the reception of the induction term of the transient electromagnetic field;
  an amplifier having an input connected directly to the bottom end of said antenna, for directly receiving and amplifying said voltage induced on the antenna by the induction term of the transient;
  a comparator circuit for comparing the output of the amplifier with a predetermined reference level to produce a signal when the amplifier output exceeds the reference level;
  a memory circuit responsive to the signal from the comparator circuit for remembering that said signal has been produced; and
  an indicator responsive to the memory circuit for indicating that the amplifier output has exceeded the reference level.

2. A transient electromagnetic field detector as set forth in claim 1 wherein said rod antenna is about 10 mm long.

3. A transient electromagnetic field detector as set forth in claim 1, wherein said memory circuit is comprised of a flip-flop.

4. A transient electromagnetic field detector for detecting a single low strength transient electromagnetic field having a frequency of at least a few tens of megahertz and duration of less than a microsecond, comprising:
  a broadband micro-antenna for producing a voltage due to the reception of the induction term of a transient electromagnetic field, said micro-antenna having a size in the transition region of the curve of the micro-antenna's detection sensitivity versus the logarithm of the micro-antenna's size where the curve changes from a region of rapidly increasing sensitivity per unit increase in antenna size to a region of very slowly increasing sensitivity per unit increase in antenna size;
  an amplifier the input of which is connected directly to one end of said antenna, for directly receiving and amplifying said voltage induced on the micro-antenna by the induction term of the transient;
  a comparator circuit for comparing the output of the amplifier with a predetermined reference level to produce a signal when the output exceeds the reference level;
  a memory circuit responsive to the signal from the comparator circuit for remembering that said signal has been produced; and
  an indicator responsive to the memory circuit for indicating that the amplifier output has exceeded the reference level.

5. A transient electromagnetic field detector as set forth in claim 4, wherein the micro-antenna is a rod antenna having a length in the range of about 5 mm to about 30 mm.

6. A transient electromagnetic field detector as set forth in claim 4, wherein the micro-antenna is a rod antenna and is approximately 10 mm long.

7. A transient electromagnetic field detector as set forth in claim 4, wherein said memory circuit is comprised of a flip-flop.

* * * * *